United States Patent
Hedler et al.

(10) Patent No.: US 9,887,339 B2
(45) Date of Patent: Feb. 6, 2018

(54) INFRARED SENSOR, THERMAL IMAGING CAMERA AND METHOD FOR PRODUCING A MICROSTRUCTURE FROM THERMOELECTRIC SENSOR RODS

(71) Applicant: SIEMENS AKTIENGESELLSCHAFT, Munich (DE)

(72) Inventors: Harry Hedler, Germering (DE); Ingo Kuehne, Kuenzelsau (DE); Markus Schieber, Munich (DE); Joerg Zapf, Munich (DE)

(73) Assignee: SIEMENS AKTIENGESELLSCHAFT, Munich (DE)

( * ) Notice: Subject to any disclaimer, the term of this patent is extended or adjusted under 35 U.S.C. 154(b) by 0 days.

(21) Appl. No.: 14/384,993

(22) PCT Filed: Feb. 11, 2013

(86) PCT No.: PCT/EP2013/052662
§ 371 (c)(1),
(2) Date: Sep. 12, 2014

(87) PCT Pub. No.: WO2013/135447
PCT Pub. Date: Sep. 19, 2013

(65) Prior Publication Data
US 2015/0048249 A1    Feb. 19, 2015

(30) Foreign Application Priority Data
Mar. 12, 2012 (DE) .................. 10 2012 203 792

(51) Int. Cl.
*H01B 12/00* (2006.01)
*G01J 5/02* (2006.01)
(Continued)

(52) U.S. Cl.
CPC ............ *H01L 35/00* (2013.01); *G01J 5/02* (2013.01); *G01J 5/023* (2013.01); *G01J 5/12* (2013.01);
(Continued)

(58) Field of Classification Search
CPC ...... G01J 5/12; G01J 5/023; G01J 5/02; G01J 2005/123; H01L 35/32; H01L 35/34; H01L 35/00
(Continued)

(56) References Cited

U.S. PATENT DOCUMENTS 3,188,473 A * 6/1965 Bates .................. G01J 5/12
250/352
4,732,619 A   3/1988 Nanigian
(Continued)

FOREIGN PATENT DOCUMENTS

DE          103 763       2/1974
DE   10 2006 055 263 A1   5/2008
(Continued)

OTHER PUBLICATIONS

Abramson et al., "Fabrication and Characterization of a Nanowire/Polymer-Based Nanocomposite for a Prototype Thermoelectric Device", 2004, Journal of Microelectromechanical Systems, 13 (3), pp. 505-513.*
(Continued)

*Primary Examiner* — David Porta
*Assistant Examiner* — Blake Riddick
(74) *Attorney, Agent, or Firm* — Slayden Grubert Beard PLLC

(57) ABSTRACT

An infrared sensor with a microstructure has a multiplicity of sensor rods protruding from a sensor base and arranged axially parallel to one another. Each of the sensor rods is designed as a thermocouple, in that a first rod end, arranged
(Continued)

on the sensor base, is electrically connected to an opposite free second rod end by both a first and a second electrically conductive rod element. The two rod elements have a different Seebeck coefficient, and the first rod element is formed as a hollow profile and the second rod element is arranged in the first rod element such that each thermocouple is formed as a single rod with a small standing area on the sensor base.

14 Claims, 13 Drawing Sheets

(51) Int. Cl.
G01J 5/12 (2006.01)
H01L 35/32 (2006.01)
H01L 35/34 (2006.01)
H01L 35/00 (2006.01)

(52) U.S. Cl.
CPC .............. *H01L 35/32* (2013.01); *H01L 35/34* (2013.01); *G01J 2005/123* (2013.01); *Y10T 29/49201* (2015.01)

(58) Field of Classification Search
USPC ................ 250/338.1, 338.4, 341.1; 136/201; 374/179
See application file for complete search history.

(56) References Cited

U.S. PATENT DOCUMENTS

| | | | |
|---|---|---|---|
| 6,372,542 | B1 | 4/2002 | Martin et al. |
| 7,868,243 | B2 | 1/2011 | Plissonnier et al. |
| 2005/0060884 | A1* | 3/2005 | Okamura et al. ............... 29/846 |
| 2005/0112872 | A1* | 5/2005 | Okamura et al. ............. 438/666 |
| 2006/0175547 | A1* | 8/2006 | DiFoggio .................. G01J 3/02 250/269.1 |
| 2008/0142066 | A1 | 6/2008 | Plissonnier et al. |
| 2008/0178921 | A1* | 7/2008 | Ye ................................ 136/225 |
| 2009/0121136 | A1* | 5/2009 | Gruss et al. ................ 250/336.1 |
| 2010/0243896 | A1* | 9/2010 | Geneczko ............... G01J 5/023 250/338.1 |
| 2012/0180839 | A1 | 7/2012 | Hedler et al. |

FOREIGN PATENT DOCUMENTS

| | | |
|---|---|---|
| DE | 10 2009 043 413 B3 | 6/2011 |
| DE | 10 2012 203 792.6 | 3/2012 |
| EP | 1 881 092 A1 | 1/2008 |
| JP | 7-283444 | 10/1995 |
| WO | WO 2011/039068 A2 | 4/2011 |
| WO | PCT/EP2013/052662 | 2/2013 |

OTHER PUBLICATIONS

Office Action dated Feb. 22, 2013 in corresponding German Patent Application No. 10 2012 203 792.6.
International Search Report dated May 22, 2013 for corresponding International Patent Application No. PCT/EP2013/052662.

\* cited by examiner

INFRARED SENSOR, THERMAL IMAGING CAMERA AND METHOD FOR PRODUCING A MICROSTRUCTURE FROM THERMOELECTRIC SENSOR RODS

CROSS REFERENCE TO RELATED APPLICATIONS

This application is based on and hereby claims priority to International Application No. PCT/EP2013/052662 filed on Feb. 11, 2013 and German Application No. 10 2012 203 792.6 filed on Mar. 12, 2012, the contents of which are hereby incorporated by reference.

BACKGROUND

The invention relates to an infrared sensor having several rod-shaped thermocouples, which are described here as sensor rods, and to a thermal imaging camera having an infrared sensor of this type. The invention also relates to a method for producing a microstructure of thermoelectric sensor rods. Infrared sensors of the type mentioned and a corresponding production method is known from DE 10 2009 043 413 B3.

According to this document, an infrared sensor can be embodied as a three dimensional microstructure in which individual thermocouples are embodied in each case from two semiconductor rods that are arranged in parallel with one another and protrude in a self-supporting manner upwards from a base of a sensor. The two semiconductor rods are electrically connected to one another at their free ends so that together they form a double rod. Furthermore, the two semiconductor rods are embodied from materials that have a different Seebeck coefficient. It is therefore possible by way of conductor tracks in the sensor base to measure a so-called thermoelectric force between said two semiconductor rods, said force being in other words an electric voltage that occurs if there is a thermal difference between the free end of the double rod at which the two semiconductor rods are connected and its end at the sensor base. Each of the double rods can represent an image element (pixel—picture element) in an imaging surface of the infrared sensor.

In the case of infrared sensors similar to the type described here, endeavors are made to use in a best possible manner the infrared radiation that impinges on the infrared sensor so that it is possible to achieve an infrared image using just a small magnitude of radiation intensity.

For this purpose, the magnitude of the electric voltage that occurs at each of the thermocouples should be as large as possible in relation to the radiation intensity. Simultaneously, it should be possible to provide as many pixels per surface area unit as possible, in other words in the case of an infrared sensor as high as possible a pixel density, in order to obtain a high spatial resolution of the infrared images that are produced using the infrared sensor.

SUMMARY

One possible object whilst obtaining thermal images is to make better use of the infrared radiation that impinges on an infrared sensor.

A considerably greater pixel density can be provided using the infrared sensor in accordance with the inventors' proposals than when using the infrared sensor described in the introduction where a double rod comprising two semiconductor rods is required for each pixel. The inventors propose an infrared sensor that comprises in contrast thereto individual sensor rods that are arranged in an axis-parallel manner with respect to one another and protrude upwards from a sensor base and each individual sensor rod represents a thermocouple. Consequently, the contact area of each thermocouple in the case of the infrared sensor is only half as large as in the case of the infrared sensor known in the related art. The compact construction is achieved by virtue of the following features.

In the case of the infrared sensor, each sensor rod end that is arranged on the sensor base and described here as a first rod end is likewise electrically connected by two electrically conductive rod elements to the opposite lying, upwards protruding free rod end. Each of the rod elements comprises a different Seebeck coefficient so that two rod elements together form a thermocouple. In the case of the infrared sensor, one of the two rod elements is embodied as a hollow profile. It can thus comprise the basic shape of a hollow cylinder or, for example, it can also be embodied as a cornered tube. The second rod element is arranged in the first rod element. In other words, the first, hollow rod element is by way of example completely filled by the second rod element or the second rod element is for its part a hollow profile that extends for example in a coaxial manner in the first rod element.

The infrared sensor comprises, as described, the advantage that the two rod elements that nest one inside the other are particularly compact or densely packed so that the sensor rod that is formed by said two rod elements only requires a small contact area on the sensor base. Consequently, it is possible to arrange many sensor rods, in other words many individual thermocouples for individual pixels, on a particularly small imaging surface. In one embodiment of the infrared sensor, sensor rods are even arranged in a raster that has a raster measurement of less than 10 micrometers, preferably less than 6 micrometers. This is not possible using the microstructures of the infrared sensors known in the related art and using conventional etching methods. In the related art, the contact area of a sensor rod on the sensor base is twice as large. Consequently, it is possible in the case of the infrared sensor to increase the surface area density of the sensor rods by the factor 4.

In order to embody the infrared sensor as a microstructure, the method provides that recesses can be embodied in a carrier layer or a substrate that can comprise by way of example monocrystalline silicon and said recesses represent in each case a negative form of a sensor rod. The two rod elements are subsequently embodied one after the other in each of these negative forms. The recesses form pores or shafts and a material that comprises a predefined Seebeck coefficient is arranged on the pore wall or shaft wall in a further part of the method. The recesses or shafts are not completely filled with this material but rather only the shaft wall is covered with the material so that a tube or in general a hollow profile is formed in the shafts in each case by arranging the material and said hollow profile subsequently forms the outer first rod element. Further, a material that comprises a different Seebeck coefficient is arranged in this hollow profile of each shaft, as a consequence of which the inner, second rod element in each shaft is also embodied in the first rod element. In order to electrically insulate the two rod elements from one another, it is possible to implement different measures between these two formation processes. An electrical insulation can be embodied in a particularly simple manner if following the arrangement of the first material on the shaft walls the surface of this material is passivated. However, it is also possible prior to arranging the material for the second rod element to introduce in addition an electrically insulating layer into the hollow body of the first rod element.

Once two rod elements that are arranged one inside the other are located in each shaft, the material of the substrate can be removed around the rod elements to such an extent that at least one part region of the respective rod element is exposed, said part region previously being in contact with the shaft wall. As a consequence, the individual sensor rods are free standing and consequently form the desired microstructure of sensor rods that are arranged in an axis-parallel manner with respect to one another. The material of the substrate is not completely removed. The remaining part of the substrate forms a component of the sensor base.

The two rod elements are electrically connected to one another at the free rod end of the sensor rod. Consequently, the arrangement of two rod elements that nest one inside the other produces a thermocouple, wherein a thermoelectric force is produced on the sensor base between the two rod elements. The electric connection at the free rod end is described hereinunder as a "hot contact" since in the case of proper use of the infrared sensor as the infrared radiation or thermal radiation impinges on the infrared sensor said free rod end forms the warmest part of the sensor rod.

The embodiment of each sensor rod as a hollow first rod element having a second rod element arranged therein also renders it possible to produce particularly sensitive thermocouples. For this purpose, it is preferred when producing a sensor rod that the so-called aspect ratio has a value of more than 20:1. The aspect ratio is the quotient from the height of a sensor rod with regard to the sensor base in relation to its electric conductor cross section that the two rod elements comprise together in total. The conductor cross section is formed in a plane in parallel with the sensor base. This aspect ratio can also be produced in a reliable manner using the method. In particular, it is possible during the production process to deposit particularly thin material layers (preferably less than 2 micrometers) on the shaft walls, as a consequence of which a very small conductor cross section is produced.

A particularly favorable temperature distribution is produced along the sensor rods if the sensor rods comprise a height greater than 100 micrometers with respect to the sensor base.

A favorable aspect ratio and simultaneously a high density of sensor rods in the raster can be achieved if the sensor rods comprise a rod diameter (measured in a plane in parallel with the sensor base) of less than 15 micrometers.

An absorption device that absorbs infrared radiation better than the first outer rod element of the respective sensor rod ensures that the sensitivity of the individual sensor rods is further increased. This absorption device can be arranged itself on the free rod end or also as a filling in the sensor rod. In contrast to the infrared sensor known in the related art, the compact arrangement of the two rod elements renders also it possible in a particularly simple manner to attach an absorption device of this type on a sensor rod.

An improved absorption rate can also be achieved in that the material of the absorption device is selected accordingly, in other words by way of example a dark, preferably black lacquer or a polymer having corresponding absorption characteristics. The absorption rate can also be improved by virtue of the fact that the surface structure of the absorption device is embodied accordingly. By way of example, it is possible for this purpose to apply to the free rod end a sponge-like layer, such as can be produced from silver or platinum (platinum sponge). Layers of this type comprise a raw surface that is particularly well suited to absorb infrared radiation.

A particularly large absorption surface area for an individual sensor rod is produced in accordance with one embodiment if a laterally protruding cap is arranged on the free rod end and the diameter of said cap is greater than the diameter of the sensor rod itself. A "hat" of this type on the free rod end can also absorb infrared radiation and convert said infrared radiation into heat that would otherwise flow past the sensor rod into the sensor base. The cap also both improves the heat absorption at the free rod end as well as protects the sensor base from warming up.

With regard to the characteristics of the thermoelectrically active rod elements themselves, it is preferred, in lieu of two different metals that comprise different Seebeck coefficients, to use as a material in each case a doped semiconductor material, in particular doped poly-silicon germanium (Poly-SiGe) and/or doped silicon also in the form of poly-silicon. In comparison to metals, the Seebeck coefficients of semiconductive materials are considerably greater. In particular, the Seebeck coefficient can be adjusted by virtue of the concentration of the doping. It is also possible to use the same base material (in other words for example poly-silicon) for the two rod elements and the respective Seebeck coefficient is adjusted merely by virtue of the different doping. This makes it particularly simple to produce the infrared sensor.

In the case of the microstructure being embodied from sensor rods, the structure can be of a self-supporting design, in other words each sensor rod protrudes upwards free of the sensor base. However, it can also be provided that a filler material, by way of example a lacquer, is arranged between the sensor rods. As a consequence, on the one hand the sensor rods are stabilized in a static manner and on the other hand it is possible by selecting the filler material to optimize the temperature distribution along the sensor rods in order to increase the sensitivity of the infrared sensor.

The sensor base can comprise conductor tracks by which it is possible to measure at each sensor rod the electromagnetic force that is generated by the infrared radiation, in other words to measure the signal voltage of each sensor rod. In order to increase the sensitivity of the infrared sensor, it is possible to provide that at least some of the sensor rods are connected electrically in series by conductor tracks in the sensor base but this is at the expense of the local resolution of the infrared sensor.

In connection with the method for producing the microstructure, the proposal also includes developments of this method and said developments include features that have already been described in connection with the infrared sensor. For this reason, the corresponding developments of the method are not described again.

Finally, the inventors propose a thermal imaging camera that comprises an embodiment of the infrared sensor.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
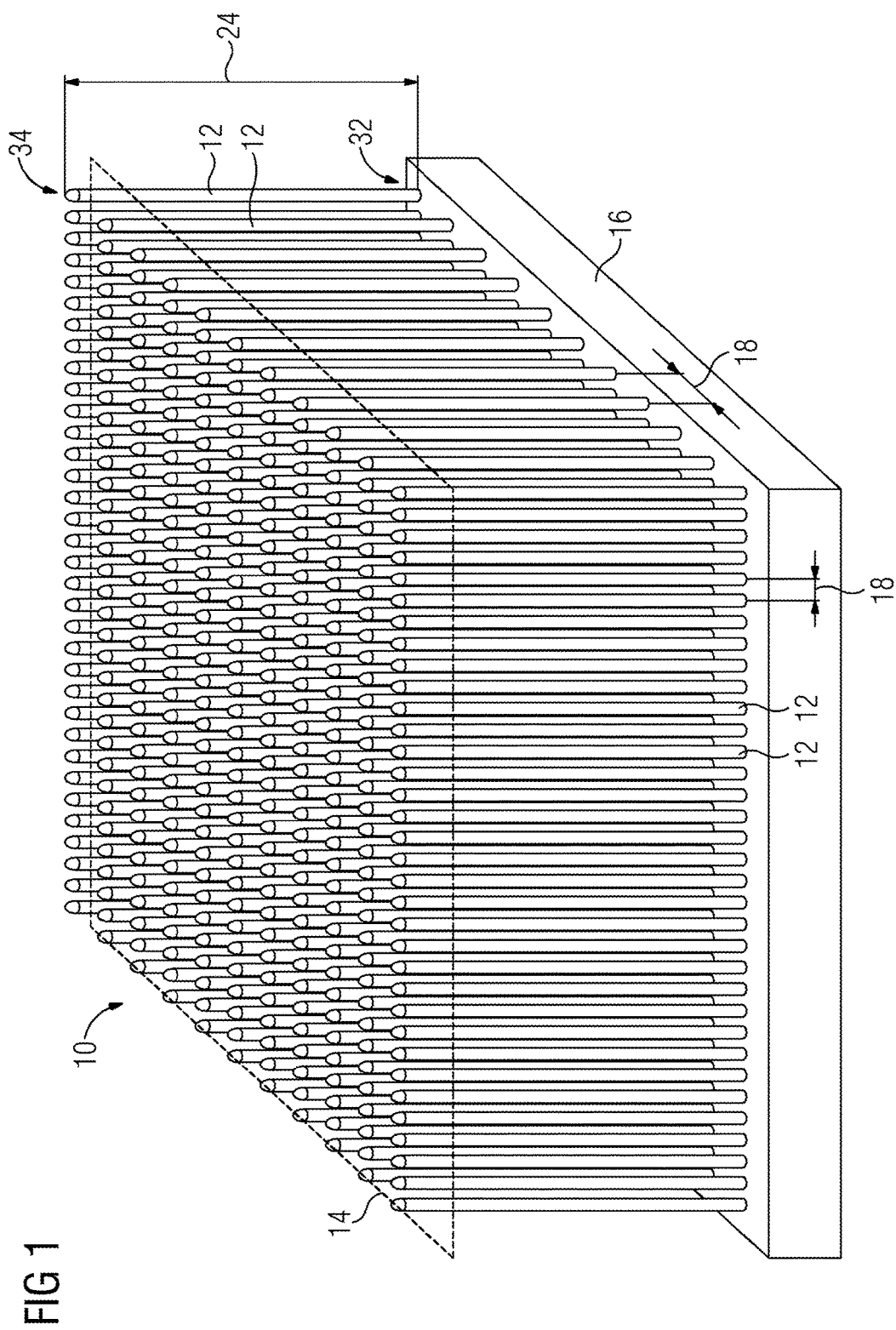
FIG. 1 illustrates a schematic illustration of a perspective view of an embodiment of a proposed infrared sensor.

Reference will now be made in detail to the preferred embodiments of the present invention, examples of which are illustrated in the accompanying drawings, wherein like reference numerals refer to like elements throughout.

In the case of the examples explained hereinunder, the described components of the infrared sensors represent in each case individual features of the infrared sensors and said features are to be considered independently of one another; said individual features further develop the infrared sensors in each case also independently of one another and consequently said individual features are also to be regarded as a part of the proposal individually or in a different combination than the combination illustrated.

FIG. 1 illustrates an infrared sensor 10 wherein a multiplicity of sensor rods 12 are arranged in a two-dimensional raster to form a sensor array or a sensor field 14 on a sensor base 16. For the sake of clarity, only some of the sensor rods 12 are provided with a reference numeral in FIG. 1. The sensor rods 12 can protrude upwards in a perpendicular manner from the sensor base 16. In the case of the infrared sensor 10, the infrared sensor comprises a microstructure that can be produced using a method known per se from microsystem technology. In the case of sensor base 16, the sensor base can be by way of example a substrate embodied from silicon. Each of the sensor rods 12 represents a thermoelectric sensor element. By virtue of measuring a thermoelectric force that is produced in each of the sensor rods 12, it is possible to allocate a thermal value in each case to individual picture elements (pixels) in an image area that corresponds to the sensor field 14 and said thermal value depends upon a thermal energy of thermal radiation or infrared radiation that is impinging on the corresponding sensor rod 12. A raster measurement 18, in other words a gap in each case between two adjacent sensor rods 12 along the row of sensor rods 12 illustrated in FIG. 1, can amount to between one and five micrometers. In total, it is possible to achieve an image resolution in the sensor field 14 of up to a mega-pixel per square millimeter. Individual sensor rods 12 can also be connected to one another by conductor tracks in the sensor base 16 so that in each case two or more sensor rods 12 produce a picture element in the sensor field 14.

Figure 2:
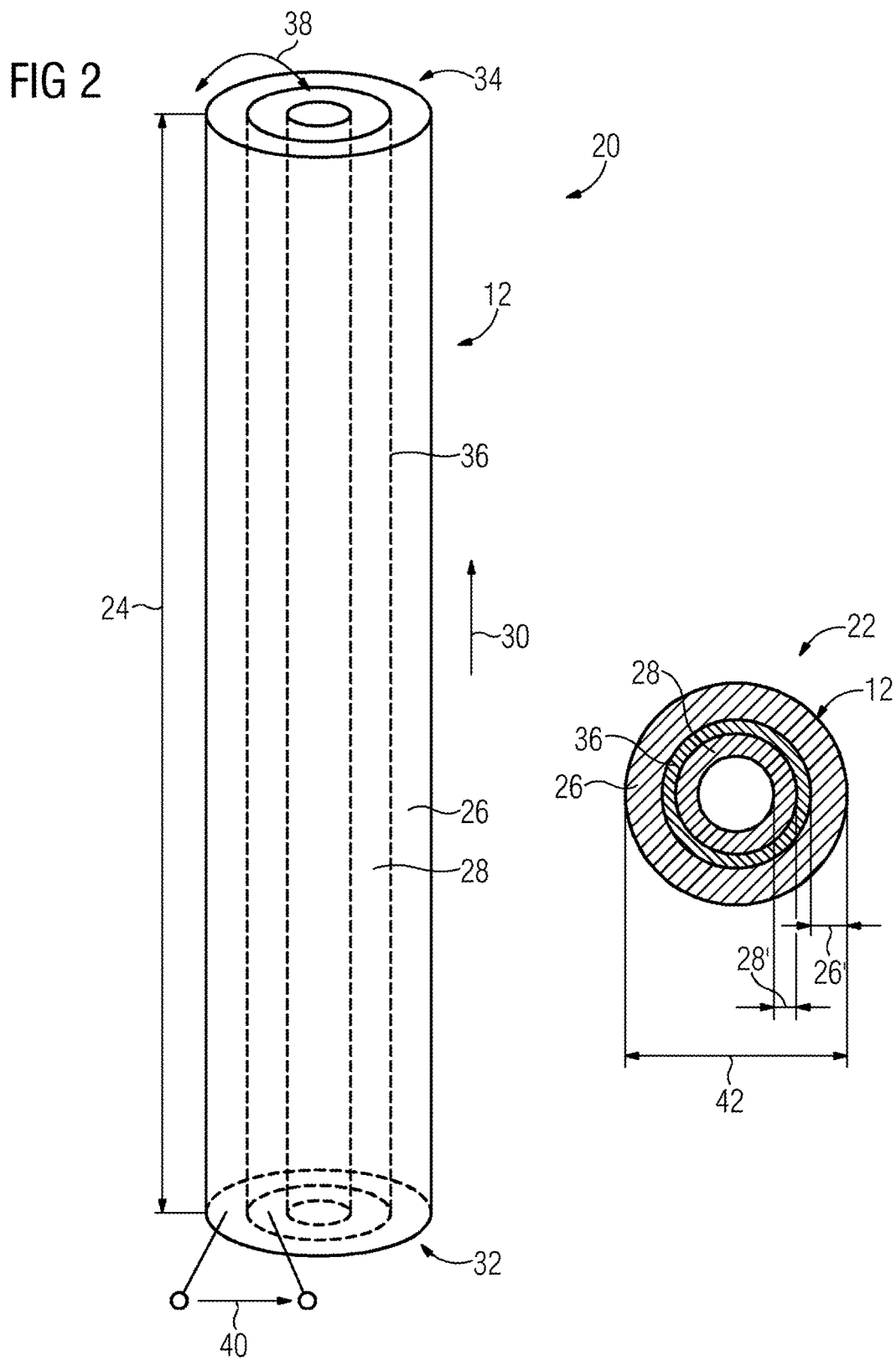
FIG. 2 illustrates a schematic illustration of a perspective view and also of a cross section of a sensor rod of an embodiment of the infrared sensor.

With reference to FIG. 2, an individual sensor rod 12 is described hereinunder and for the sake of simplicity it is assumed that the description is of a sensor rod of the infrared sensor 10 shown in FIG. 1.

FIG. 2 illustrates both a perspective view 20 and also a cross section 22. The cross section 22 is formed in a plane in parallel with the surface of the sensor base 16. The construction of the sensor rod 12 in this figure can be representative for all the sensor rods 12 that are located in the infrared sensor 10. A length or height 24 of the sensor rod 12 can amount to 100 micrometers or also several hundred micrometers.

The sensor rod 12 comprises an outer rod element 26 in which an inner rod element 28 is located. The two rod elements 26, 28 extend along a longitudinal direction 30 from a rod end 32, which is located on the sensor base 16, as far as the opposite lying free rod end 34. The two rod elements 26, 28 are embodied from an electrically conductive material, wherein the Seebeck coefficient of each rod element differs from one another. The rod element 26 can be formed by way of example from a p-doped semiconductor material and the rod element 28 can be formed from an n-doped semiconductor material. The two rod elements 26, 28 are electrically insulated from one another by an insulation layer 36. The two rod elements 26, 28 are electrically connected to one another at the free end 34 by an electrical connection 38 that is indicated in FIG. 2 only symbolically by a double arrow. The sensor rod 12 represents overall a thermoelectric element. The electrical connection 38 at the free rod end 34 forms the "hot" contact. If the infrared sensor 10 is held in the direction towards a source of infrared radiation in such a manner that the longitudinal direction 30 extends in the direction towards the source, the free end 34 of the sensor rod 12 thus warms to a greater extent with respect to the rod end 32 that is located on the sensor base 16 and it is possible at the sensor base 16 between the rod elements 26 and 28 to measure the electric signal voltage 40 that is produced by the Seebeck effect.

The rod elements 26, 28 are not arranged separately on the sensor base 16 as is the case in the related art but rather they are guided one inside the other but electrically insulated from one another as far as the electrical connection 38. A thermocouple of this type that is produced using microstructure technology is only visible from the outside as a single body that comprises the shape of a long cylinder. The rod element 26 can by way of example comprise the shape of a hollow cylinder. However, said rod element can also comprise a cross section 22 that has a rectangular or square or any other shaped contour. The inner rod element 28 can likewise comprise the shape of a hollow cylinder and can be arranged in a coaxial manner in the outer rod element 26. The inner space of the sensor rod can also be completely filled by the rod element 28. The rod element 28 must not necessarily comprise a closed shape that has an annular cross section 22 but rather can also be embodied by way of example in the shape of a semi-circle or also in a different manner it can cover only a part of the insulation layer 36. A diameter 42 of the rod element 26 in the cross section 22 can comprise a value in the region of less than 15 micrometers, preferably less than 10 micrometers.

The signal voltage 40 is dependent upon the absorbed thermal energy P and also on the length 24 of the sensor rod 12 and the conductor cross section of the two rod elements 26, 28 as is produced in the cross section 22. The conductor cross section is consequently produced from the layer thicknesses 26', 28' of the two material thicknesses from which the rod elements 26, 28 are formed, said layer thicknesses being measured in the cross section 22. In the case of the length 24 that can be achieved in this case of greater than 100 micrometers up to several hundred micrometers and a supposed diameter 42 of 10 micrometers and less and layer thicknesses 26', 28' of the walls of the rod elements 26, 28 in the cross section 22, an aspect ratio L/A of 10/µm and more is produced. This is a particularly favorable aspect ratio. The signal voltage U (described in FIG. 2 as the signal voltage 40) comprises corresponding values that arise from the following equation:

$$U=a/T*L/A*P,$$

wherein:

a represents the difference between the Seebeck coefficients of the two rod elements 26, 28, I represents the thermal conductivity of said rod elements, L represents the length or height 24 of the rod element 12, and A represents the area of the rod elements 26 and 28 in the cross section 22.

Figure 3:
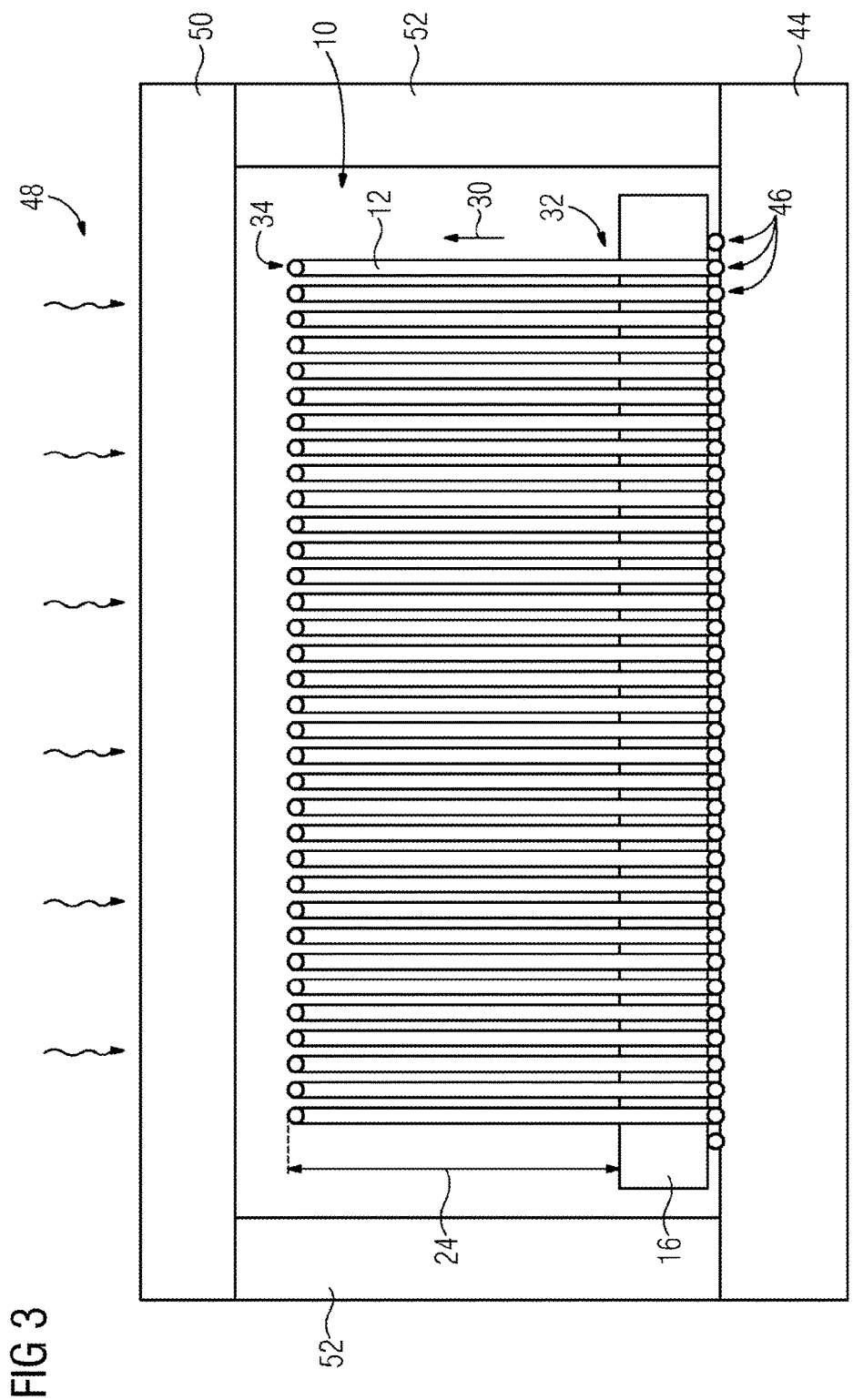
FIG. 3 illustrates a schematic illustration of a sectional view of an embodiment of the proposed thermal imaging camera.
Figure 4:
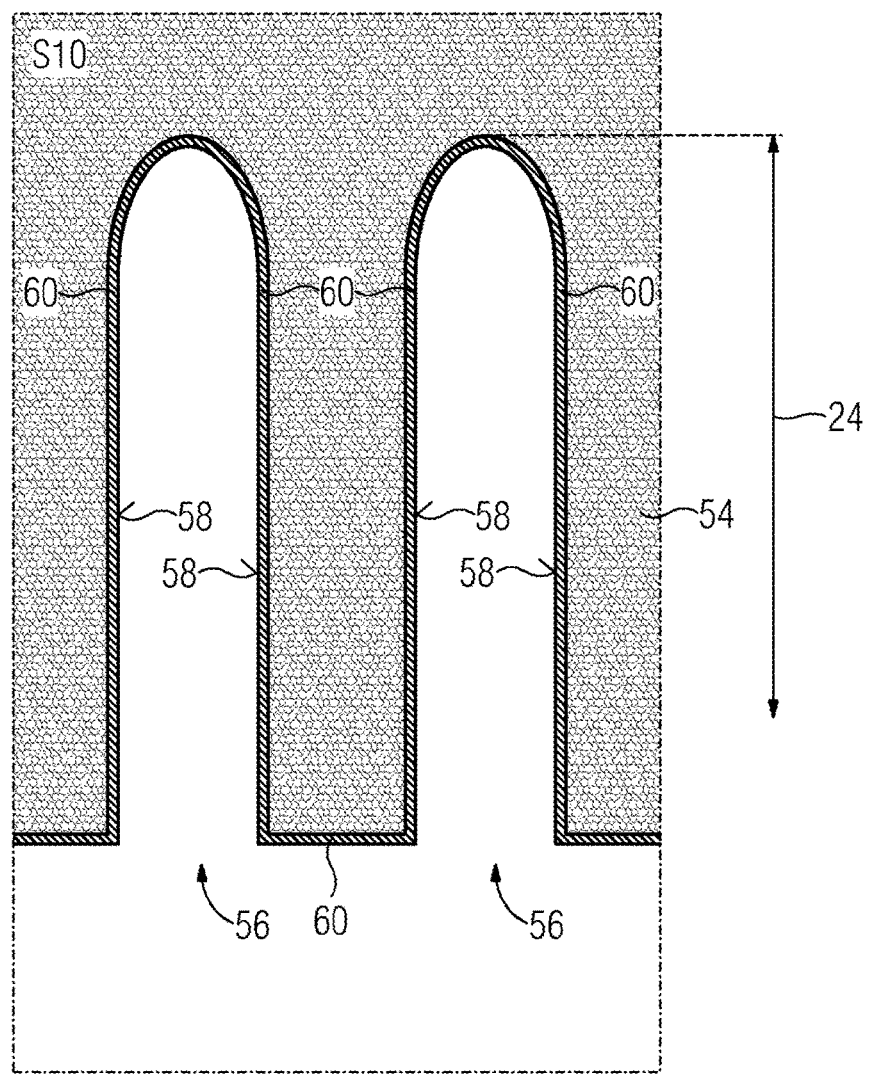
FIGS. 4-11 illustrate a schematic illustration of cross-sectional views of a semiconductor substrate for illustrating the method relating to one embodiment of the proposed production method.
Figure 5:
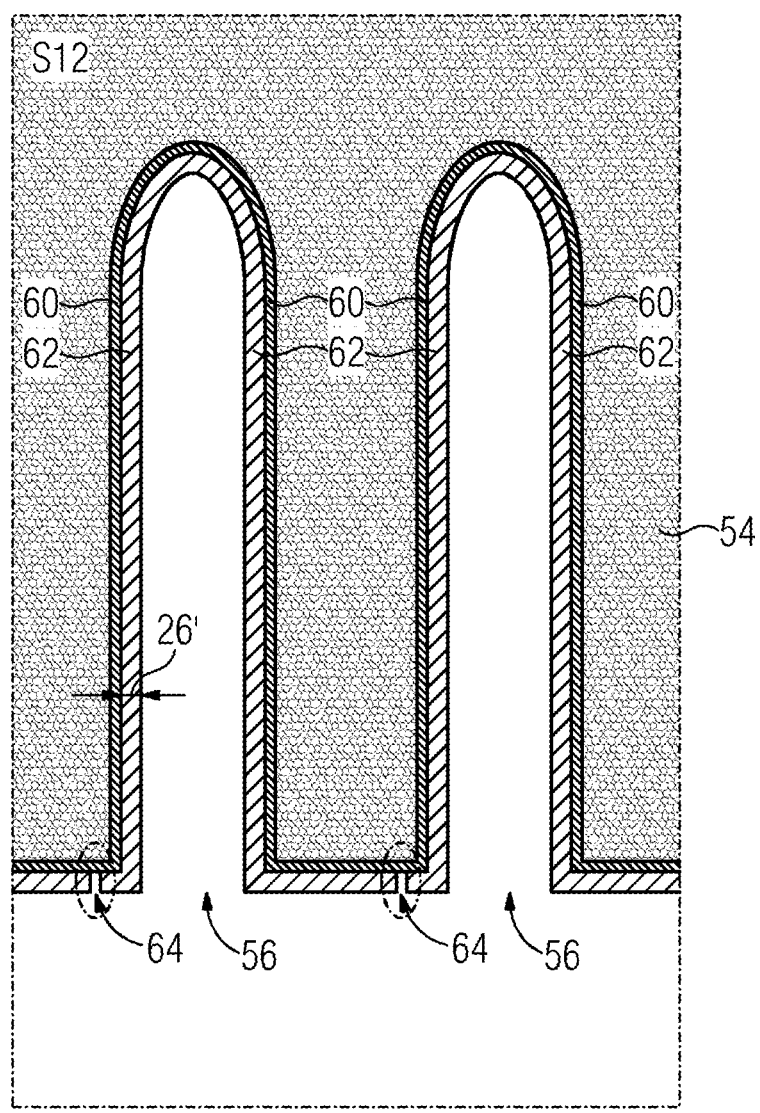
Figure 6:
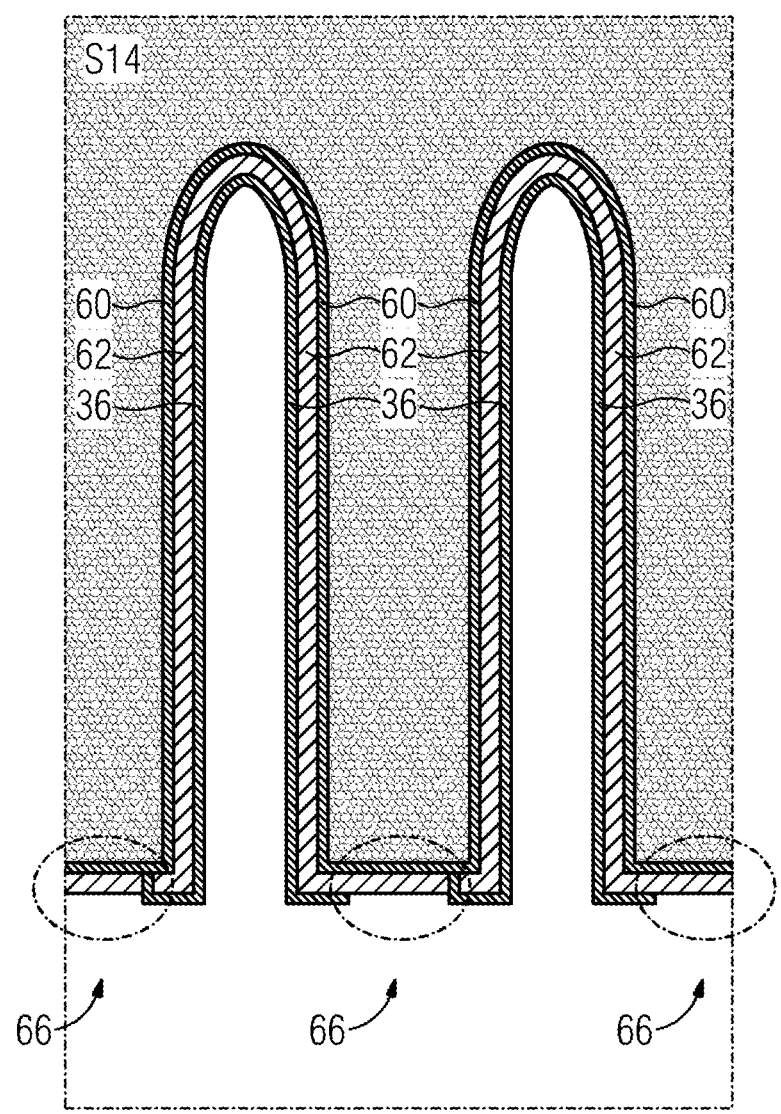
Figure 7:
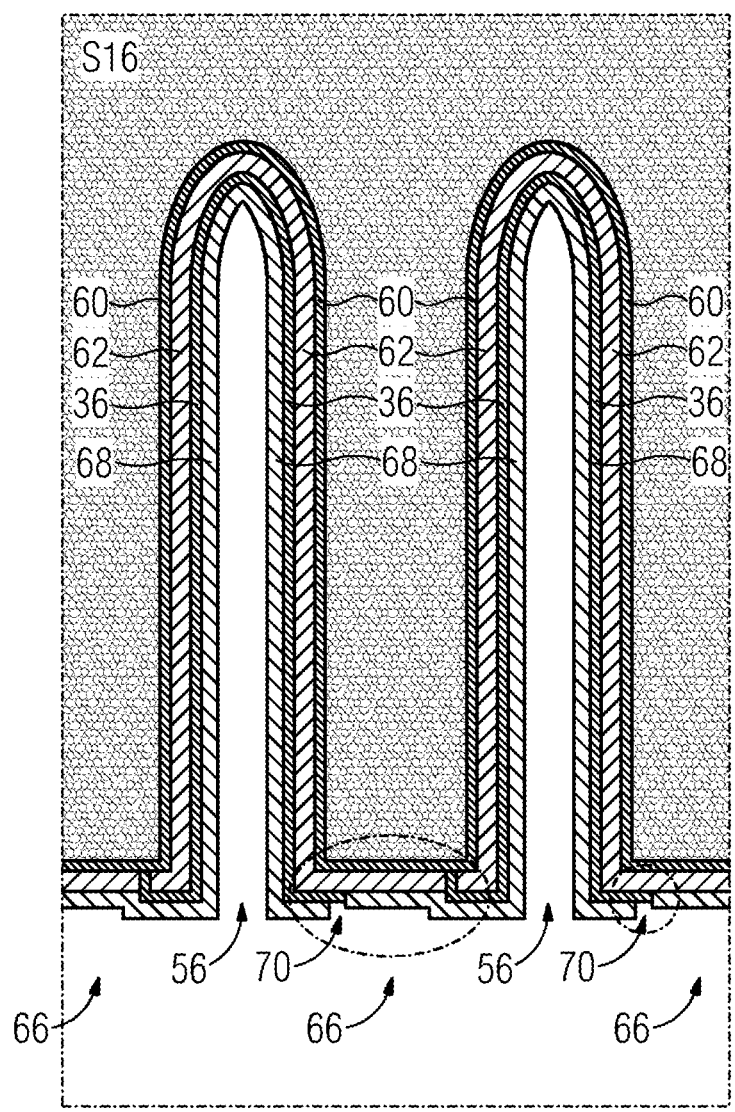
Figure 8:
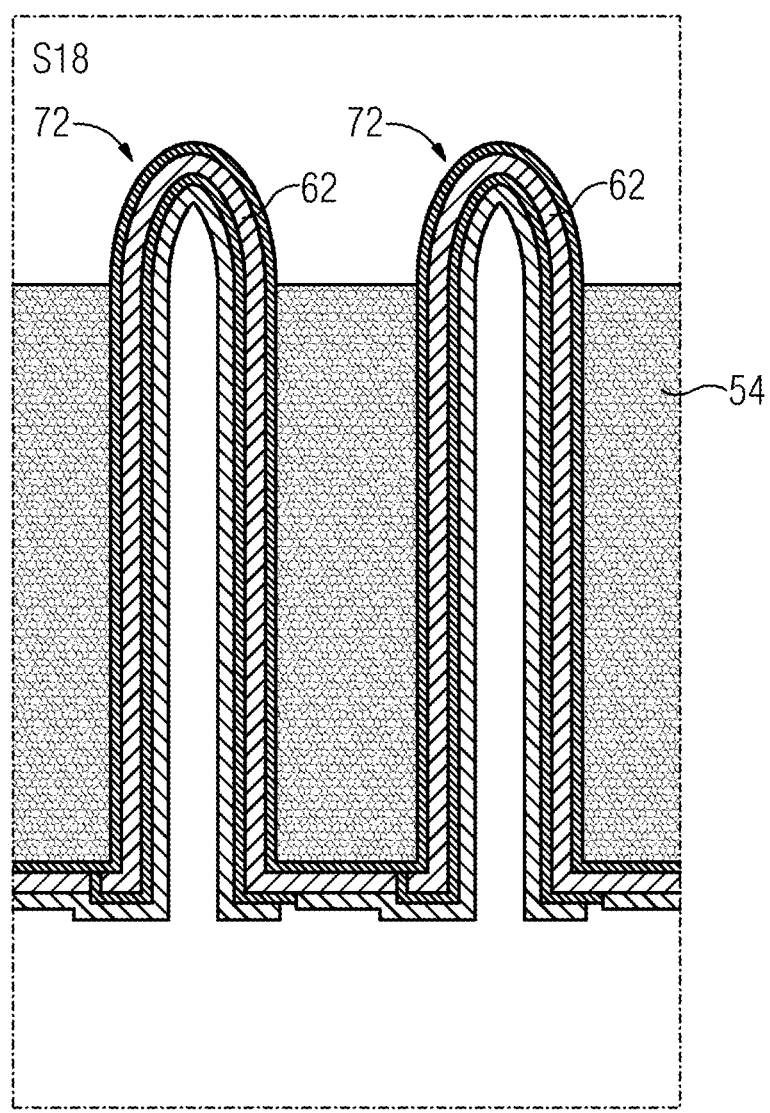
Figure 9:
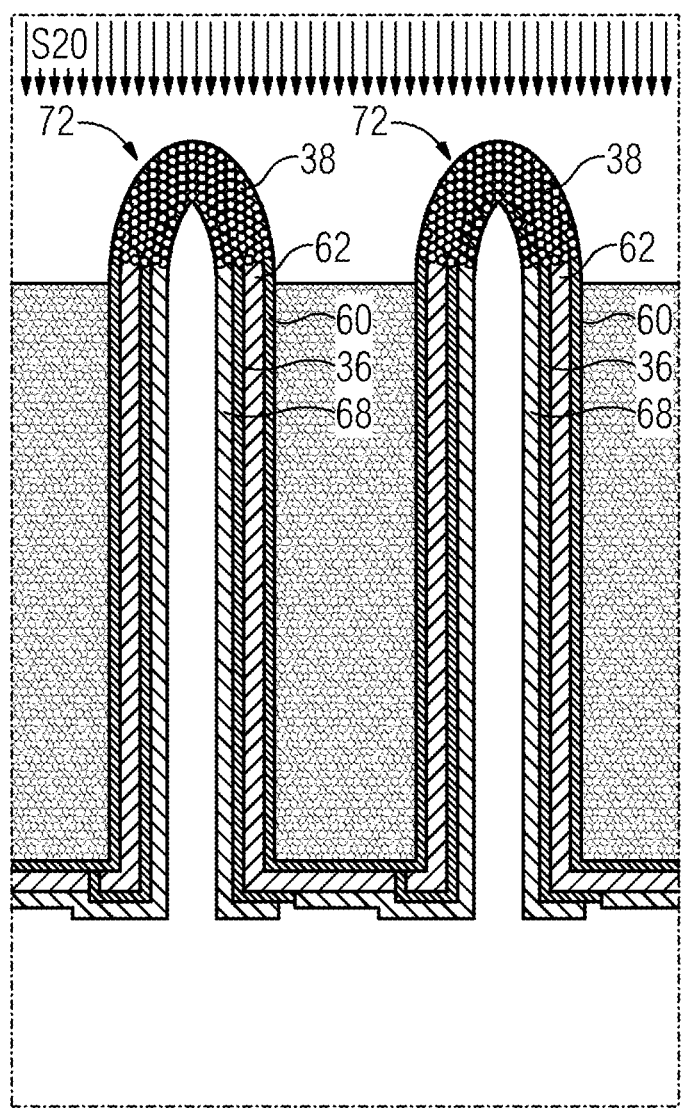
Figure 10:
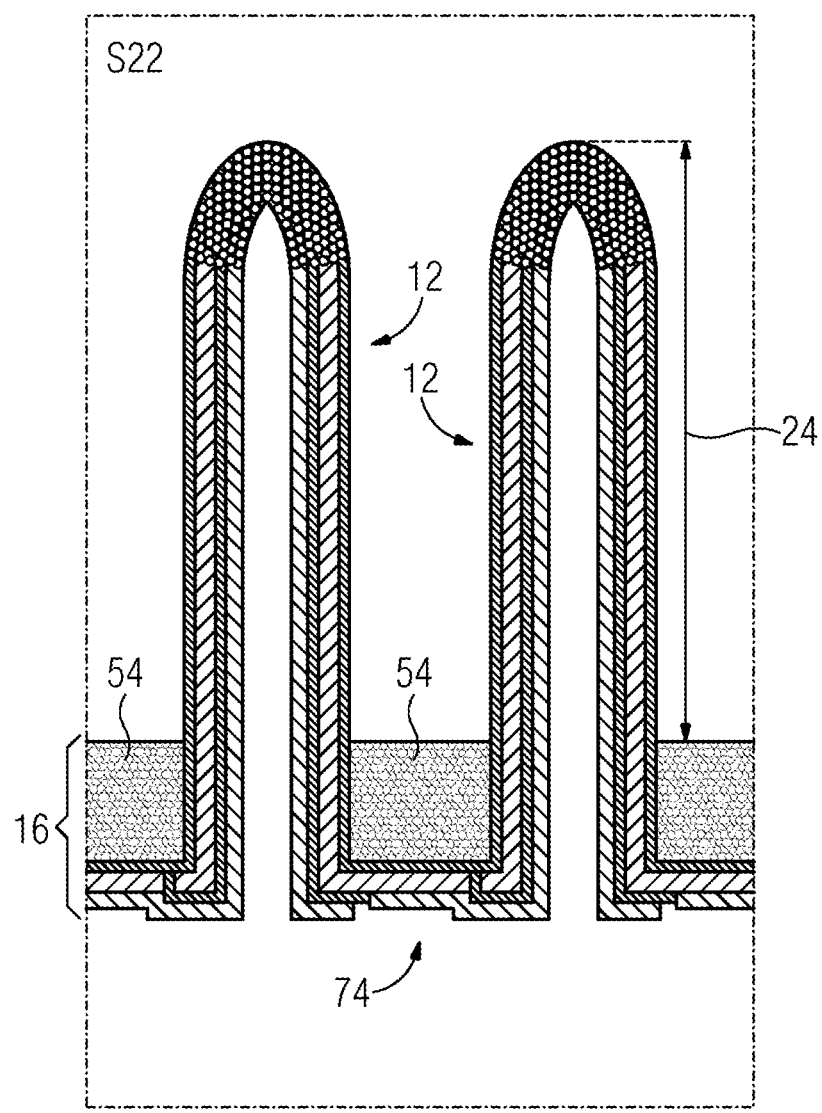

It is explained hereinunder with reference to FIG. 3 how the signal voltage 40 that is produced in the individual rod elements 12 can be measured in a thermal imaging camera and how a thermal image can be produced from said signal voltage. FIG. 3 illustrates for this purpose an infrared sensor and for the sake of simplicity it is assumed that the infrared sensor being described is the infrared sensor 10 shown in FIG. 1. However, the infrared sensor can also be an infrared sensor of a different construction. The infrared sensor 10 is installed in a thermal imaging camera and can be fastened to an integrated circuit 44 (IC) of the thermal imaging camera. The integrated circuit 44 can be by way of example an ASIC (application specific integrated circuit). The integrated circuit 44 comprises connection contacts 46 of which for the sake of clarity in FIG. 3 only some are provided with a reference numeral. The free ends 34 are warmed in the example illustrated by infrared radiation 48 that passes through a protective window 50 of the thermal imaging camera and impinges on the infrared sensor 10, said protective window being embodied from a material that is transparent for the infrared radiation 48. Protective walls 52 of the thermal imaging camera protect the infrared sensor 10 on both sides in a manner perpendicular to the longitudinal extension 30 of the rod elements 12 from any infrared radiation that is incident at the side. The rod elements 26, 28 of the individual sensor rods 12 are electrically connected by way of the connection contacts 46 to measuring circuits (not illustrated) of the integrated circuit 44. The signal voltage 40 of the individual sensor elements 12 is measured in each case by the measuring circuits and in dependence upon the measured voltage a digital measurement value is provided as a pixel value. The pixel value corresponds to the thermal energy P that is absorbed by the hot contacts of the free rod ends 34 of the individual sensor rods 12. However, it is also possible to combine several sensor rods 12 to form a single pixel if an increased sensitivity of the sensor is desired. It is possible by reading out the pixel values relating to each of the sensor rods 12 by a signal processor (not illustrated) to obtain a digital thermal image relating to the sensor field 14.

A possible method for producing an infrared sensor such as by way of example the infrared sensor 10 is described hereinunder with reference to FIGS. 4 to 11.

As has already been explained, it is preferred that the thermoelectrically active rod elements 26, 28 are embodied only as extremely thin layers (cf. layer thicknesses 26', 28') in order to achieve as little as possible heat dissipation between the hot contact at the free rod end 34 and the cold rod end 32. This is achieved by the following production process used in microsystem technology.

Figure 12:
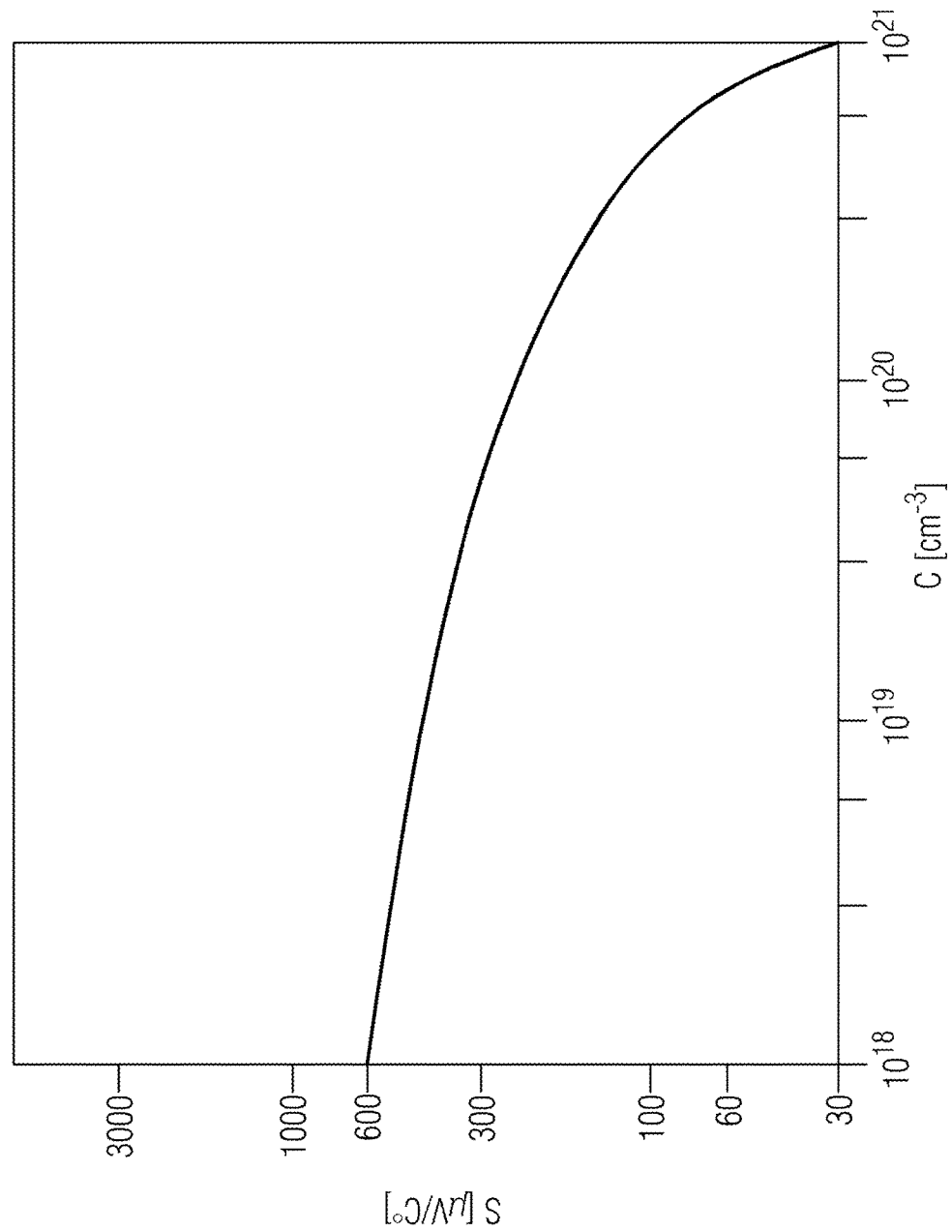
FIG. 12 illustrates a graph showing a schematized progression of a Seebeck coefficient as is produced in dependence upon a doping of a semiconductor.

First in S10 (FIG. 4), a rod-shaped or column-shaped recess 56 for each sensor rod 12 is etched by etching in a substrate 54 that is preferably embodied from silicon. The PAECE method (Photo Assisted Electro Chemical Etching) is preferably used as the etching method, alternatively dry etching methods can also be used. The depth of the etched recesses 56 is greater than the subsequent resulting height 24 of the individual sensor rods 12. The walls 58 of the recesses 56 are subsequently passivated which is preferably achieved by heating or oxidation. This produces a passivation layer 60. Subsequently, in S12 (FIG. 5), a layer 62 having the layer thickness 26' is formed by depositing a material having a predetermined Seebeck coefficient on the wall 58 in the recesses 56. FIG. 12 illustrates how a desired Seebeck coefficient S can be achieved by doping the poly-silicon with a concentration C of a doping material. The concentration C applies both for p-doping and also for n-doping. It is particularly advantageous that the conventional materials known in the related art can be used as a doping material. It is also possible to use for example poly-SiGe in lieu of poly-silicon.

The material can be deposited preferably by chemical vapor deposition (CVD). The material is preferably a doped poly-silicon since this method is particularly suitable for use in a CVD process. The process can be implemented as a dry process or also as a wet process.

The layers 62 of the individual recesses 56 are electrically separated from one another by etching the recesses 64. This produces the electrically conductive rod elements 26 from the layer 62. The etching process can be performed as a dry process or a wet process. Next in S14 (FIG. 6), the electrically insulating layer 36 is formed on the layer 62. This can be achieved again by thermal oxidation or also by depositing an electrically insulating material by CVD. Furthermore, in S14, contacting regions 66 are exposed by etching (dry process or wet process) in the electrically insulating layer 36 and the wall 62 can be accessed by said contacting regions. Next in S16 (FIG. 7), a layer 68 of a further electrically conductive material having a different Seebeck coefficient than that of the layer 62 is deposited in the recesses 56 having the layer thickness 28'. This material can also be by way of example a doped poly-silicon whose Seebeck coefficient can be achieved by way of example by a curve illustrated in FIG. 12. The material of the layer 68 contacts the material of the layer 62 directly at the contacting regions 66 so that the two electrically conductive layers 62, 68 are electrically contacted. The layer 68 is divided into the individual rod elements 28 by etching (dry process or wet process) the recesses 70.

Further in S18 (FIG. 8), the substrate 54 is removed from the tips 72 of the layers 62 by a wet or dry etching process. The exposed layers 62 are rendered electrically conductive in S20 (FIG. 9) by means by way of example of an ion implantation method or by a sputtering method so that the electrically insulating layer 36 is electrically conductive between the layers 62 and 68 at the tips 72 as a consequence of which the electrical connection 38 is formed at the tips 72. The implantation of the electrically conductive elements in the tips 72 is symbolized in FIG. 9 by the arrows. Subsequently, in S22 (FIG. 10), further material of the substrate 54 is removed using a wet or dry etching method. The sensor rods 12 are completely exposed so that they comprise the height 24 above the sensor base 16. The sensor base 16 comprises the remaining substrate 54 and the contact regions of the rod elements 26 (layer 62) or rather element 28 (layer 68), said contact regions being located on the sensor rear face 74.

Figure 11:
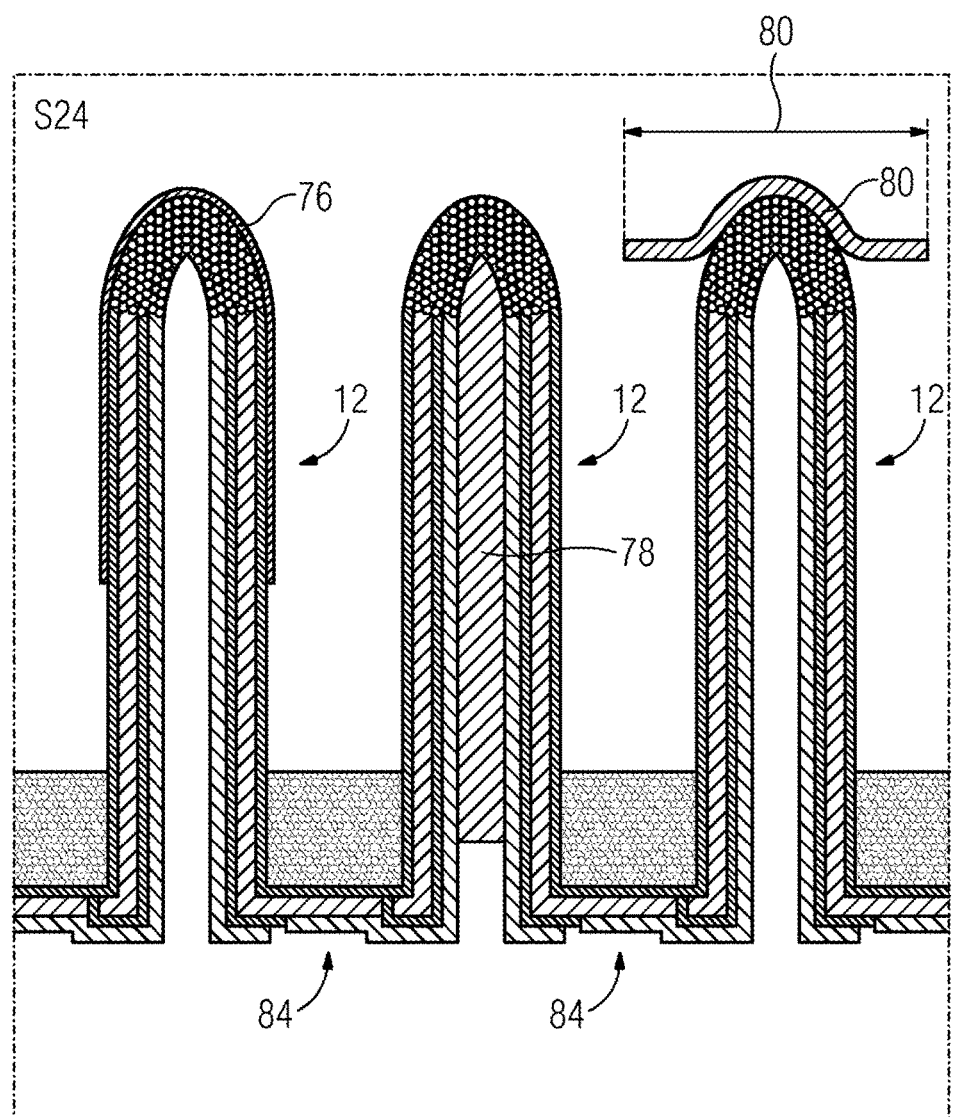

In S24 (FIG. 11), it is possible to also form absorption devices 76, 78, 80. FIG. 11 illustrates three possibilities for this purpose, wherein the common illustration in FIG. 11 is not to mean that it is necessary for all the sensor elements 12 to comprise different absorption devices 76, 78, 80.

The absorption device 76 can comprise a layer that covers the tip 72 and that can be deposited by way of example by the CVD method or by physical vapor deposition (PVD). The layers can be sponge-like layers (by way of example silver or platinum), semi-metal layers, polymer layers or a dark, preferably black, lacquer.

The absorption device 78 can be produced by filling the sensor rod 12 with a liquid that subsequently hardens, by way of example to form a polymer or a black lacquer.

The absorption device 80 comprises a hat-shaped cap and the brim of said hat-shaped cap forms an absorption surface area having a diameter 82 for the absorption of the infrared radiation 48, said absorption surface area being greater than the diameter 42 of the sensor rod itself. The hat-shaped cap can be formed by way of example by depositing (PVD, CVD) an absorbing material between the S20 and S22. Suitable materials are again the materials that have been described in connection with the absorption device 76.

A series connection 84 of the adjacent sensor rods 12 is produced by virtue of the fact that the layers 62 and 68 of adjacent sensor rods 12 contact the contacting regions 66. In this case, the total of the signal voltages 40 of all sensor rods 12 that are series-connected to one another in the series connection 84 is measured by the integrated circuit 44 in each case only across two connection contacts 46 at the outer ends of these rows. In order to determine the signal voltages 40 of the individual sensor rods 12, the layers 62 and 68 of two adjacent sensor rods 12 must be electrically insulated one from the other. However, it is preferred that one of the layers 62, 68 is used as a common electrode (ground potential), said layers being connected by way of a common ground wire to a common connection contact 46. As a consequence, the weight of the wiring connecting to the circuit 44 is reduced, nonetheless it is possible to measure individual signal voltages 40 separately at the sensor rods 12. In other words, only one additional signal wire is required per pixel since the second signal wire is formed by the ground wire.

The necessary contact between the layers 62, 68 on the sensor base rear face 74 and the respective connection contacts 46 can be achieved by way of corresponding lithography and etching that are known per se.

As has already been mentioned, the length 24 of a sensor rod 12 can comprise a value in the range from L=100 micrometers to even L=1000 micrometers.

Figure 13:
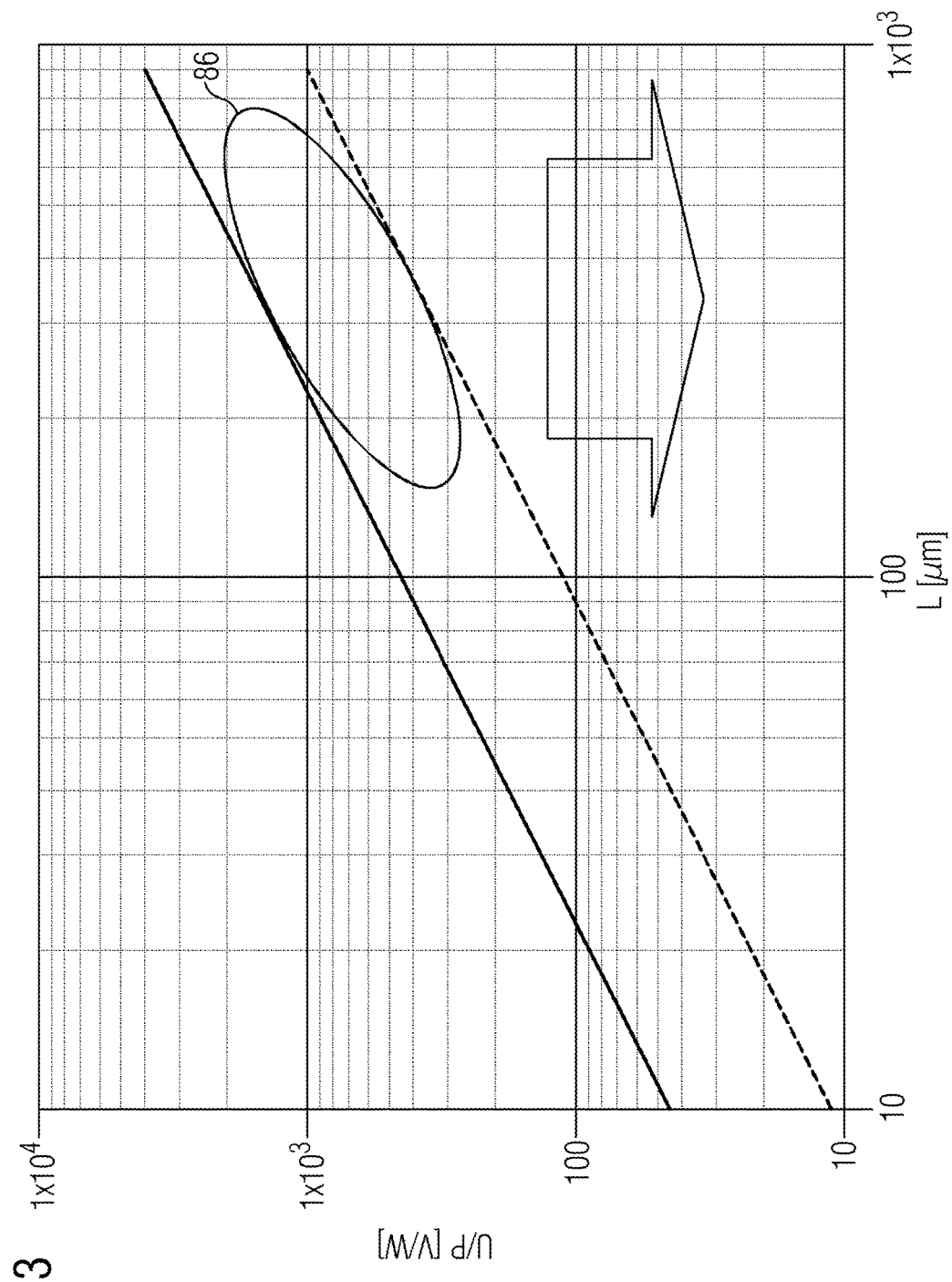
FIG. 13 illustrates a graph for illustrating the sensitivity of one embodiment of the infrared sensor in dependence upon a rod height of the sensor rods.

FIG. 13 illustrates in this respect the magnitude of sensitivity, in other words the magnitude of signal voltage U in relation to the absorbed energy P, said magnitude of sensitivity being produced if a sensor rod 12 comprises the dimensions described in connection with FIG. 2. An operating range 86 of possible operating points of one sensor rod 12 is marked in the diagram shown in FIG. 13. It is possible by accordingly doping the materials of the layer 62, 68 by a Seebeck coefficient of +/−250 micro V/K to achieve magnitudes of sensitivity of the sensor rods that are greater than 1000 V/W, which greatly exceeds the characteristics of the related art.

The examples illustrate how to produce high density, large area array sensors that render it possible to achieve a high resolution, finely pixelated infrared image. The basis for this is a structuring technology using a silicon micro machining technique which renders it possible to produce arrays of this type that have thermoelectric sensor rods having a very high aspect ratio.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV,* 69 USPQ2d 1865 (Fed. Cir. 2004).

The invention claimed is:

1. An infrared sensor comprising:
   a sensor base including a set of connection contacts arrayed across the sensor base;
   a microstructure formed of a plurality of sensor rods that are arranged in an axis-parallel manner with respect to one another, the sensor rods protruding upwardly from the sensor base,
   each of the sensor rods having a first rod end that is arranged on the sensor base coupled to a respective one of the set of connection contacts providing a series connection of rows of adjacent sensor rods, and a rounded second rod end opposite the first rod end,
   and
   an integrated circuit receiving an output signal voltage from one or more of the rows of adjacent sensor rods,
   the first and second rod ends electrically connected both by a first electrically conductive rod element and by a second electrically conductive rod element, the first and second rod elements having different Seebeck coefficients such that each of the sensor rods is embodied as a thermocouple, the first rod element having a hollow profile with a hollow center, the second rod element being arranged in the hollow center of the first rod element,
   each of the sensor rods including an insulating layer separating the respective first rod element and the second rod element along a length of the rod elements, wherein a material of the insulating layer rendered electrically conductive at a tip provides an electrical connection between the first rod element and the second rod element at the respective second rod ends.

2. The infrared sensor as claimed in claim 1, wherein the sensor rods are arranged as a sensor field in a raster that has a raster dimension of less than 10 μm.

3. The infrared sensor as claimed in claim 1, wherein the sensor rods are arranged as a sensor field in a raster that has a raster dimension of less than 6 μm.

4. The infrared sensor as claimed in claim 1, wherein each sensor rod has an aspect ratio of more than 20:1, the aspect ratio being formed from a height of the sensor rod divided by a conductor cross section of the first and second rod elements.

5. The infrared sensor as claimed in claim 1, wherein each sensor rod has a height greater than 100 μm with respect to the sensor base.

6. The infrared sensor as claimed in claim 1, wherein each sensor rod has a height in a range from 100 μm to 1000 μm with respect to the sensor base.

7. The infrared sensor as claimed in claim 1, wherein each sensor rod has a rod diameter of less than 15 μm.

8. The infrared sensor as claimed in claim 1, further comprising an absorption device disposed at the second rod end and formed of a material and/or has a surface structure that causes the absorption device to absorb more infrared radiation than the first rod element.

9. The infrared sensor as claimed in claim 8, wherein the absorption device comprises a laterally protruding cap that is arranged on the second rod end, and the laterally protruding cap has a greater diameter than the first rod element.

10. The infrared sensor as claimed in claim 1, wherein at least one of the first and second rod elements is formed from a material selected from the group consisting of doped poly-SiGe and doped silicon.

11. The infrared sensor as claimed in claim 1, wherein
the first and second rod elements are formed from doped silicon, and
one of the first and second rod elements has n-type doping and another of the first and second rod elements has p-type doping.

12. The infrared sensor as claimed in claim 1, wherein the sensor rods are supported in a self-supporting manner or are supported by a filler material that encompasses the sensor rods.

13. A thermal imaging camera having an infrared sensor comprising:
a sensor base including a set of connection contacts arrayed across the sensor base; and
a microstructure formed of a plurality of sensor rods that are arranged in an axis-parallel manner with respect to one another, the sensor rods protruding upwardly from the sensor base,
each of the sensor rods having a first rod end arranged on the sensor base coupled to a respective one of the set of connection contacts providing a series connection of rows of adjacent sensor rods, and a rounded second rod end opposite the first rod end, and
an integrated circuit receiving an output signal voltage from one or more of the rows of adjacent sensor rods;
the first and second rod ends electrically connected both by a first electrically conductive rod element and by a second electrically conductive rod element, the first and second rod elements having different Seebeck coefficients such that each of the sensor rods is embodied as a thermocouple, wherein the plurality of absorption devices absorbs more infrared radiation than the first rod element,
the first rod element having a hollow profile with a hollow center, the second rod element being arranged in the hollow center of the first rod element, and
each of the sensor rods including an insulating layer physically separating respective first rod element and the second rod element along a length of the rod elements, wherein a material of the insulating layer rendered electrically conductive at a tip provides an electrical connection between the first rod element and the second rod element at the respective second rod ends.

14. A method for producing a microstructure of thermoelectric sensor rods, the method comprising:
forming shafts in a substrate, the substrate being formed from a substrate material, the shafts having respective recesses, each being delimited by a recess wall, the substrate providing a set of connection contacts arrayed across the substrate;
forming first rod elements respectively in the shafts, each first rod element being formed along on the recess wall of one of the recesses, the first rod elements being formed from a material that has a predefined first Seebeck coefficient, the first rod elements each having a hollow portion;
forming an insulating layer in the respective hollow portion of each first rod element;
forming second rod elements respectively in the first rod elements, each second rod element being formed in a respective hollow portion of the insulating layers, the second rod elements being formed from a material that has a predefined second Seebeck coefficient different from the first Seebeck coefficient;
removing the substrate material and thereby exposing at least a region of the first rod elements; and
altering a conductive property of each insulating layer in a first end of the first rod elements and the second rod elements to provide electrical connectivity between the first rod elements and the second rod elements within a rounded rod end opposite the substrate;
wherein a second end of each first rod element and each second rod element is coupled to a respective connection contact providing a series connection of rows of adjacent sensor rods.

* * * * *